United States Patent
Dani et al.

(10) Patent No.: US 7,253,523 B2
(45) Date of Patent: Aug. 7, 2007

(54) REWORKABLE THERMAL INTERFACE MATERIAL

(75) Inventors: Ashay A. Dani, Chandler, AZ (US); Scott Gilbert, Chandler, AZ (US); Ajit V. Sathe, Chandler, AZ (US); Ravi Prasher, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 577 days.

(21) Appl. No.: 10/630,550

(22) Filed: Jul. 29, 2003

(65) Prior Publication Data
US 2005/0027055 A1    Feb. 3, 2005

(51) Int. Cl.
*H01L 23/10* (2006.01)
(52) U.S. Cl. ............... 257/762; 257/706; 257/707; 257/E23.075
(58) Field of Classification Search ......... 257/762, 257/706, 707, 717, 722, 720
See application file for complete search history.

(56) References Cited

U.S. PATENT DOCUMENTS

2002/0000239 A1* 1/2002 Sachdev et al. ............ 134/2

2003/0203188 A1* 10/2003 H. ........................ 428/328

FOREIGN PATENT DOCUMENTS

WO    WO 00/36893    * 6/2000

* cited by examiner

*Primary Examiner*—Andy Huynh
*Assistant Examiner*—Thinh T Nguyen
(74) *Attorney, Agent, or Firm*—Schwegman, Lundberg, Woessner & Kluth P.A.

(57) ABSTRACT

A process of making a reworkable thermal interface material is described. The reworkable thermal interface material is bonded to a die and a heat sink. The reworkable thermal interface material includes a phase-change polymer matrix material. Other materials in the reworkable thermal interface material can include heat transfer particles and low melting-point metal particles. The phase-change polymer matrix material includes a melting temperature below a selected temperature and the heat transfer particles have a melting temperature substantially above the selected temperature. The heat transfer particles act as a spacer limit, which holds the thermal interface material to a given bond-line thickness during use.

29 Claims, 4 Drawing Sheets

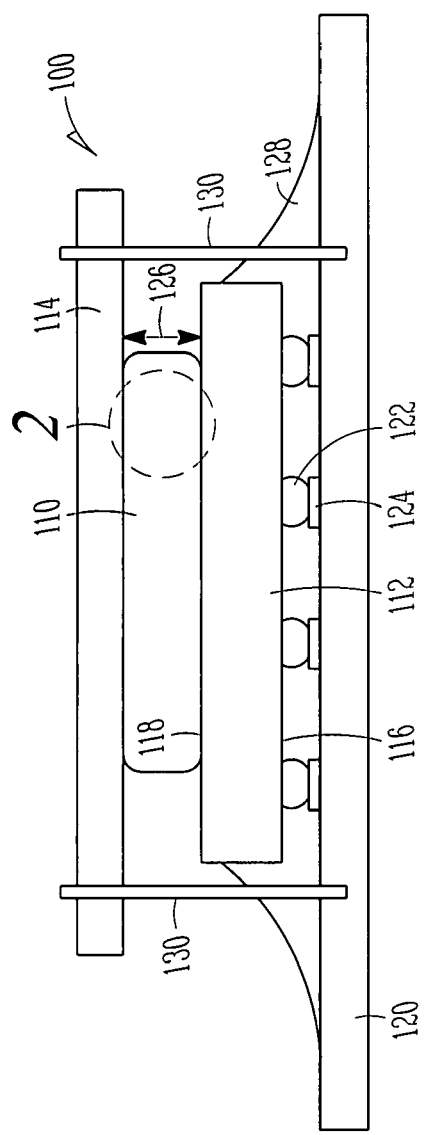
FIG. 1
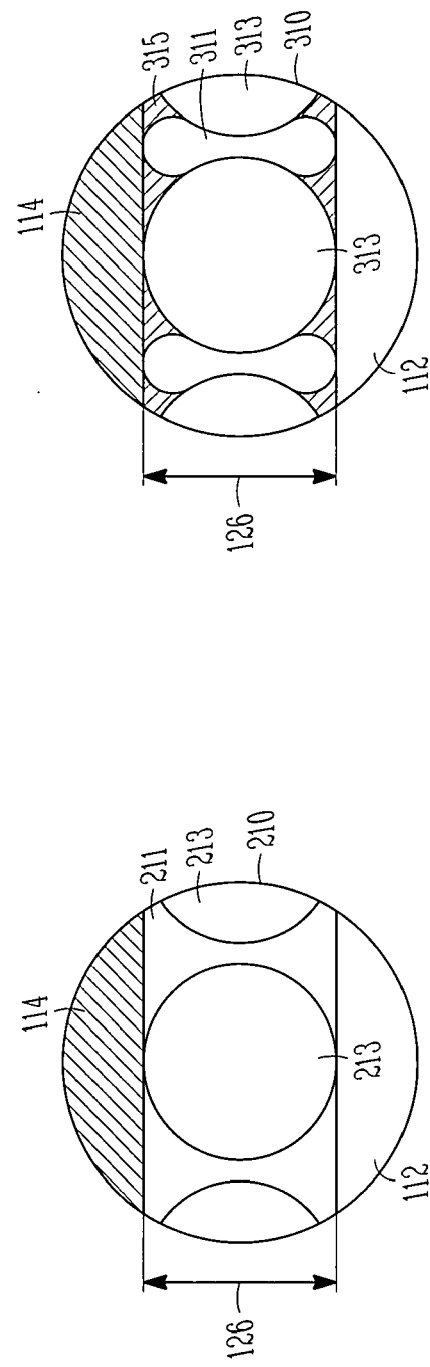
FIG. 3
FIG. 2

REWORKABLE THERMAL INTERFACE MATERIAL

TECHNICAL FIELD

Disclosed embodiments relate to a reworkable thermal interface material for a heat sink and die package. The reworkable thermal interface material is coupled with a die and a heat sink to form a mobile package.

BACKGROUND INFORMATION

An integrated circuit (IC) die is often fabricated into a microelectronic device such as a processor. A thermal interface is often needed to allow the die to reject heat more efficiently. In "bare die" technology, a mobile IC such as a processor for a notebook computer, has a small heat sink attached to the back surface of the die.

Various techniques have been employed to transfer heat away from a bare die. These techniques typically include passive and active configurations. One passive configuration involves a heat spreader in thermal contact with the backside of a packaged die.

A heat spreader is employed to spread and dissipate the heat generated by a die, to minimize concentrated high-heat locations within the die. A heat spreader is attached proximate the backside of the die with a thermally conductive material, such as a thermal interface material (TIM). A TIM can include, for example, thermally conductive gels, thermal greases, or solders.

BRIEF DESCRIPTION OF THE DRAWINGS

In order to understand the manner in which embodiments are obtained, a more particular description of various embodiments briefly described above will be rendered by reference to the appended drawings. These drawings depict only typical embodiments that are not necessarily drawn to scale and are not to be considered to be limiting of its scope. Some embodiments will be described and explained with additional specificity and detail through the use of the accompanying drawings in which:

FIG. 1 is a side cross-section of a package according to an embodiment;

FIG. 2 is a detail section taken from FIG. 1 according to an embodiment;

FIG. 3 is a detail section taken from FIG. 1 according to an embodiment;

DETAILED DESCRIPTION

Figure 4:
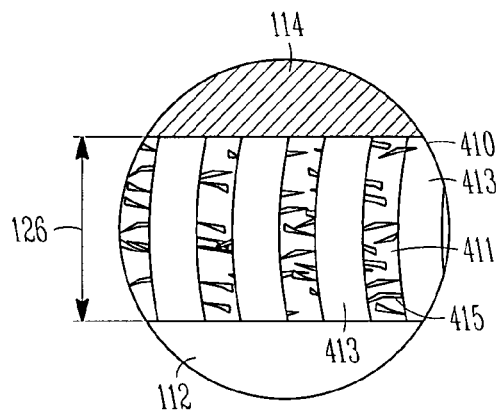
FIG. 4 is a detail section taken from FIG. 1 according to an embodiment.

The following description includes terms, such as upper, lower, first, second, etc. that are used for descriptive purposes only and are not to be construed as limiting. The embodiments of a device or article described herein can be manufactured, used, or shipped in a number of positions and orientations. The term "thermal interface" generally refers to an article that is interposed between a die and a heat sink. The terms "die" and "processor" generally refer to the physical object that is the basic workpiece that is transformed by various process operations into the desired integrated circuit device. A board is typically a resin-impregnated fiberglass structure that acts as a mounting substrate for the die. A die is usually singulated from a wafer, and wafers may be made of semiconducting, non-semiconducting, or combinations of semiconducting and non-semiconducting materials. The term "reworked" generally refers to the removal of a first thermal interface subsystem that is not destructive to the bare die, and the optional replacement thereof by a second thermal interface subsystem.

Various ratios of size and volume are presented in this disclosure. Where percentages are given without specific units or designations, they are understood to be weight percentages.

Reference will now be made to the drawings wherein like structures will be provided with like reference designations. In order to show the structures of embodiments most clearly, the drawings included herein are diagrammatic representations of various embodiments. Thus, the actual appearance of the fabricated structures, for example in a photomicrograph, may appear different while still incorporating the essential structures of embodiments. Moreover, the drawings show only the structures necessary to understand the embodiments. Additional structures known in the art have not been included to maintain the clarity of the drawings.

FIG. 1 is a side cross-section of a package 100 according to an embodiment. The package 100 includes an interface subsystem 110 that is disposed against a die 112. The interface subsystem 110 can also be referred to as a thermal interface material (TIM). In an embodiment, the interface subsystem 110 is disposed against a die 112 and a thermal management device 114. The thermal management device 114 is also referred to herein as a first heat sink. The interface subsystem 110 includes a phase-change material (PCM) that acts as a matrix for at least one interstitial heat transfer structure. In an embodiment, the interface subsystem 110 is a heat transfer composite that includes a PCM, a wetting agent, and at least one interstitial heat transfer structure.

The package 100 includes the die 112 with an active surface 116 and a backside surface 118. In an embodiment, the die 112 is a processor in a mobile electronic device such as a notebook computer.

In an embodiment, the die 112 is attached to a mounting substrate 120 at a series of electrical bumps 122 that are in turn each mounted on a series of bond pads 124. The electrical bumps 122 make contact with the active surface 116 of the die 112. By contrast, the interface subsystem 110 makes thermal contact with the backside surface 118 of the die 112. A bond-line thickness (BLT) 126 is depicted. The BLT 126 is the thickness of the interface subsystem 110. In an embodiment, the BLT 126 is in a range from about 10 micrometer (μm) to about 50 μm. In an embodiment, the BLT 126 is in a range from about 15 μm to about 40 μm. In an embodiment, the BLT is in a range from about 20 μm to about 30 μm. In an embodiment, the BLT is about 25 μm.

In an embodiment, the mounting substrate 120 is a printed circuit board (PCB), such as a main board, a motherboard, a mezzanine board, an expansion card, or another mounting substrate with a specific application. The die 112 is also encapsulated with an underfill material 128 according to an embodiment.

The phase-change quality of the interface subsystem 110 allows for closer contact of interstitial heat transfer structures in the interface subsystem 110, between the die 112 and the thermal management device 114.

In an embodiment, the thermal management device 114 is secured against the interface subsystem 110 by being fastened to the mounting substrate 120 by a structure such as a bolt 130. In an embodiment, the thermal management device 114 is fastened by a structure such as a clip, that can be removed by hand or with the assistance of a tool such as a pry bar. Other structures that are known in the art can be employed to secure the thermal management device 114 against the interface subsystem 110.

FIG. 2 is a detail section taken from FIG. 1 according to an embodiment. The detail section is taken from the dashed line 2 in FIG. 1. FIG. 2 depicts the die 112 and the thermal management device 114, which sandwich the interface subsystem 210. In an embodiment, the interface subsystem 210 includes a PCM 211 that acts as a matrix for a first interstitial heat transfer structure 213.

In an embodiment, the PCM 211 is an organic material that includes a melting or softening temperature in a range from about 25° C. to about 100° C. In an embodiment, the PCM 211 is an organic material that includes a melting or softening temperature in a range from about 30° C. to about 60° C. In an embodiment, the PCM 211 is a composition that includes an epoxy and a wetting agent. In this embodiment, the PCM 211 epoxy is softened by the wetting agent to allow the PCM 211 to flow during processing and preparation for application to a package. During processing and preparation, a thermal process is carried out after application of the PCM 211 to the die 112 and/or the thermal management device 114. The thermal process causes a portion of the wetting agent to volatilize, and the PCM shrinks in volume accordingly. In an embodiment, thermal processing does not entirely volatilize the wetting agent.

In an embodiment, the PCM 211 is a silicone composition. In an embodiment, the PCM 211 is an amino epoxy composition. In an embodiment, the PCM 211 is an acrylate composition. In an embodiment, the PCM 211 is an olifin resin composition. In an embodiment, the PCM 211 is a low-viscosity vinyl composition. In an embodiment, the PCM 211 is an elastomer selected from silicone, acrylic, natural rubber, synthetic rubber, or the like. In an embodiment, the PCM 211 is an acrylic polymer.

In an embodiment, a wetting agent is used to assist the PCM in filling against the die 112 and the thermal management device 114. In an embodiment the wetting agent includes an alcohol such as cetyl alcohol or the like. In an embodiment the wetting agent includes an ester such as tetraphenyl ester or the like. In an embodiment the wetting agent includes a styrene such as polystyrene or the like. Other wetting agents can be selected.

In an embodiment, the wetting agent is selected to achieve a stable presence with the PCM within the temperature range experienced for the interface subsystem 210. In an embodiment, the PCM is about 4-75 percent of the total weight of the interface subsystem 210. Accordingly, the wetting agent is about 1-25 percent of the total weight of the interface subsystem 210, and the first interstitial heat transfer structure 213 is about 5-95 percent of the total weight of the interface subsystem 210.

In an embodiment, the first interstitial heat transfer structure 213 is a particle that includes a high thermal conductivity, which is conducive to efficient heat transfer away from the die 112. In an embodiment, the first interstitial heat transfer structure 213 is an aluminum or aluminum alloy particle. In an embodiment, the first interstitial heat transfer structure 213 is an aluminum or aluminum alloy sphere. In an embodiment, the first interstitial heat transfer structure 213 is a copper or copper alloy particle. In an embodiment, the first interstitial heat transfer structure 213 is a copper or copper alloy sphere. In an embodiment, the first interstitial heat transfer structure 213 is a silver or silver alloy particle. In an embodiment, the first interstitial heat transfer structure 213 is a silver or silver alloy sphere. In an embodiment, the first interstitial heat transfer structure 213 is a nickel or nickel alloy particle. In an embodiment, the first interstitial heat transfer structure 213 is a nickel or nickel alloy sphere.

In an embodiment, the first interstitial heat transfer structure 213 is ceramic material such as silica, ceria, thoria, zirconia, or the like.

In an embodiment, the first interstitial heat transfer structure 213 is a carbon structure such as a carbon particle or a graphite particle. In an embodiment, the first interstitial heat transfer structure 213 is a carbon structure such as a carbon fiber or a graphite fiber.

In an embodiment, the first interstitial heat transfer structure 213 is a low melting-point metal that resists bonding with either of the die 212 or the thermal management device 214. In any event, the low melting-point metal, if it tends to bond with either of the die 212 or the thermal management device 214, can be removed by slight heating, which is heating that does not damage the electronics of the die 212.

In an embodiment, the first interstitial heat transfer structure 213 is a low-melting-point metal. In an embodiment the first interstitial heat transfer structure 213 is INDALLOY® 51, manufactured by the Indium Corporation of America of Utica, N.Y. In an embodiment, the first interstitial heat transfer structure 213 is a Ga—In—Sn alloy with a melting point of about 11° C. In an embodiment the first interstitial heat transfer structure 213 is INDALLOY® 60, a Ga—In alloy with a melting point of about 16° C. In an embodiment the first interstitial heat transfer structure 213 is francium, Fr with a melting point of about 27° C. In an embodiment the first interstitial heat transfer structure 213 is cesium, Cs with a melting point of about 28° C. In an embodiment the first interstitial heat transfer structure 213 is gallium, Ga with a melting point of about 30° C. In an embodiment the first interstitial heat transfer structure 213 is rubidium, Rb with a melting point of about 39° C. In an embodiment the first interstitial heat transfer structure 213 is INDALLOY® 117, a Bi—Pb—In—Sn—Cd material with a melting point of about 47° C. In an embodiment the first interstitial heat transfer structure 213 is INDALLOY® 136, a Bi—In—Pb—Sn material with a melting point of about 58° C. In an embodiment the first interstitial heat transfer structure 213 is INDALLOY® 19, an In—Bi—Sn material with a melting point of about 60° C. In an embodiment the first interstitial heat transfer structure 213 is INDALLOY® 158, a Bi—Pb—Sn—Cd material with a melting point of about 70° C. In an embodiment the first interstitial heat transfer structure 213 is INDALLOY® 162, an In—Bi material with a melting point of about 72° C. In an embodiment the first interstitial heat transfer structure 213 is INDALLOY® 174, a Bi—In—Sn material with a melting point of about 79° C. In an embodiment the first interstitial heat transfer structure 213 is INDALLOY® 8, an In—Sn—Cd material with a melting point of about 93° C. In an embodiment the first interstitial heat transfer structure 213 is INDALLOY® 42, a Bi—Sn—Pb material with a melting point of about 96° C.

In an embodiment, a combination of two of the above materials is included in the first interstitial heat transfer structure 213. In an embodiment, a combination of three or more of the above materials is included in the first interstitial heat transfer structure 213.

In an embodiment, FIG. 2 depicts the first interstitial heat transfer structure 213 as substantially bridging the BLT 126 between the die 112 and the thermal management device 114. In this embodiment, the BLT 126 has been minimized according to the size of the largest first interstitial heat transfer structure 213. In an embodiment, the first interstitial heat transfer structure 213 is any of the metal particles or spheres set forth in this disclosure. In an embodiment, the first interstitial heat transfer structure 213 is any of the ceramic particles or spheres set forth in this disclosure. In an embodiment, the first interstitial heat transfer structure 213 is any of the carbon or graphite particles or spheres set forth in this disclosure.

In a method embodiment, the interface subsystem 210 is reworked. Accordingly, the interface subsystem 210 is removed and a replacement interface subsystem is installed. In an embodiment, the interface subsystem 210 is heated above the softening temperature of the PCM 211 and the interface subsystem 210 is removed by physical action such as gentle wiping or gentle scraping. In an embodiment, the interface subsystem 210 is reworked at room temperature such as about 25° C. and the interface subsystem 210 is removed by physical action such as gentle wiping or gentle scraping.

FIG. 3 is a detail section taken from FIG. 1 according to an embodiment. The detail section is taken from the dashed line 2 in FIG. 1. FIG. 3 depicts the die 112 and the thermal management device 114, which sandwich the interface subsystem 310. In an embodiment, the interface subsystem 310 includes a PCM 311 that acts as a matrix for a first interstitial heat transfer structure 313 and a second interstitial heat transfer structure 315.

In an embodiment, the first interstitial heat transfer structure 313 is any of the metals, metal alloys, ceramics, or carbon or graphite particles or fibers set forth in this disclosure. The second interstitial heat transfer structure 315 is any of the low melting-point metals or their combinations as set forth in this disclosure. During thermal processing and/or field use of the interface subsystem 310, the low melting-point metal that is the second interstitial heat transfer structure 315, tends to wet a portion of the first interstitial heat transfer structure 313, and also the die 112 and the thermal management device 114. In this embodiment, a heat transfer percolation path between the die 112 and the thermal management device 114 is improved from a point-to-point contact path between particles, to a broader interface between and among the first interstitial heat transfer structure 313, the second interstitial heat transfer structure 315, and the die 112 and thermal management device 114.

In an embodiment, the interface subsystem 310 is reworked. In an embodiment, the interface subsystem 310 is heated above the softening temperature of the PCM 311, and also above the solidus temperature of the low melting-point metal that is the second interstitial heat transfer structure 315. In an embodiment, the interface subsystem 310 is reworked at room temperature such as about 25° C. and the interface subsystem 310 is removed by physical action such as gentle wiping or gentle scraping.

In this method, even if some chemical wetting by the low melting-point metal on the die 112 or the thermal management device 114 occurs, the second interstitial heat transfer structure 315 can be removed with minimal effort and with only incidental, non-destructive wear to the backside surface 118 of the die.

FIG. 4 is a detail section taken from FIG. 1 according to an embodiment. The detail section is taken from the dashed line 2 in FIG. 1. FIG. 4 depicts the die 112 and the thermal management device 114, which sandwich the interface subsystem 410. In an embodiment, the interface subsystem 410 includes a PCM 411 that acts as a matrix for a first interstitial heat transfer structure 413 and a second interstitial heat transfer structure 415.

In an embodiment, the first interstitial heat transfer structure 413 is an aligned carbon or graphite fiber, which makes a first contact at the die 112 and a second contact at the thermal management device 114. In an embodiment, the first interstitial heat transfer structure 413 includes an aspect ratio of height (between the die 112 and the thermal management device 114) to width (laterally in FIG. 4) of greater than one. In an embodiment, the first interstitial heat transfer structure 413 includes an aspect ratio of about two. In an embodiment, the first interstitial heat transfer structure 413 includes an aspect ratio of about four. In an embodiment, the first interstitial heat transfer structure 413 includes an aspect ratio of about eight. In an embodiment, the first interstitial heat transfer structure 413 includes an aspect ratio of about 20 or greater. As the aspect ratio increases, the total of the interface subsystem 410 becomes more pliant during thermal processing and/or field use because the first interstitial heat transfer structure 413 is more capable of bending as illustrated, along its major axis. In an embodiment, any of the enumerated BLTs 126 set forth in this disclosure, is combined with any of the embodiments that are described in FIG. 4.

In an embodiment, the second interstitial heat transfer structure 415 is a fiber that is randomly dispersed in the PCM 411. In an embodiment, the second interstitial heat transfer structure 415 has an aspect ratio of about 20:1, and it has an average diameter of less than about 1 μm. During thermal processing and/or field use, the PCM 411 softens, but the second interstitial heat transfer structure 415 is sufficiently packed around the first interstitial heat transfer structure 413, that the first interstitial heat transfer structure 413 cannot significantly rotate away from its anisotropic heat-transfer orientation between the die 112 and the thermal management device 114.

In an embodiment, the PCM 411 and the second interstitial heat transfer structure 415 are kneaded together and formed into a composite sheet. The composite sheet is applied to a planar arrangement of aligned first interstitial heat transfer structures 413 to form a laminate. In this embodiment, the laminate is rolled and pressed to form a composite bar stock. Thereafter the interface subsystem is cut from the composite bar stock at a thickness at or near a selected BLT 126.

In an embodiment, the PCM 411 retains a sufficiently high viscosity even at its highest contemplated use temperature, to resist any significant rotation of the first interstitial heat transfer structure 413 away from its anisotropic heat-transfer orientation between the die 112 and the thermal management device 114. In an embodiment where the PCM 411 retains such viscosity, only the first interstitial heat transfer structure 413 is present.

In another embodiment, the first interstitial heat transfer structure 413 is a carbon or graphite fiber that is coupled with a low melting-point metal such as any of the low melting-point metals set forth in this disclosure.

Figure 5:
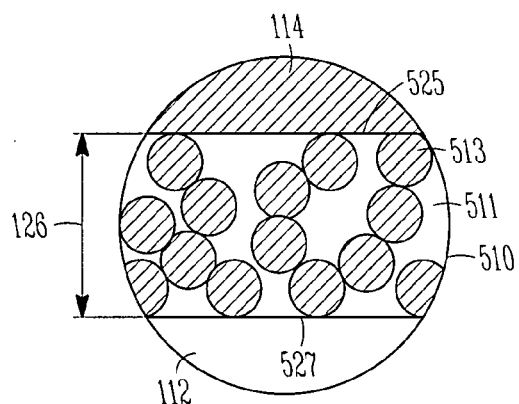
FIG. 5 is a detail section taken from FIG. 1 according to an embodiment.

FIG. 5 is a detail section taken from FIG. 1 according to an embodiment. The detail section is taken from the dashed line 2 in FIG. 1. FIG. 5 depicts the die 112 and the thermal management device 114, which sandwich the interface subsystem 510. In an embodiment, the interface subsystem 510 includes a PCM 511 that acts as a matrix for a first interstitial heat transfer structure 513. The PCM 511 and the first interstitial heat transfer structure 513, among other components are part of an article with a first surface 525 and a second surface 527 that are parallel planar.

In an embodiment, the first interstitial heat transfer structure 513 is dispersion of particles that have an average diameter that is less than the BLT 126. A heat-percolation path is therefore established between the die 112 and the thermal management device 114. In an embodiment, the average diameter of the first interstitial heat transfer structure 513 is a fraction of the BLT 126 of about one-half or greater. In an embodiment, the average diameter of the first interstitial heat transfer structure 513 is a fraction of the BLT 126 of about one-third. In an embodiment, the average diameter of the first interstitial heat transfer structure 513 is a fraction of the BLT 126 of about one-fourth. In an embodiment, the average diameter of the first interstitial heat transfer structure 513 is a fraction of the BLT 126 of about one-fifth. In an embodiment, the average diameter of the first interstitial heat transfer structure 513 is a fraction of the BLT 126 of about one-tenth. In an embodiment, the average diameter of the first interstitial heat transfer structure 513 is a fraction of the BLT 126 of about one-twentieth. In an embodiment, any of the enumerated BLTs 126 set forth in this disclosure, is combined with any of the embodiments that are described in FIG. 5.

In an embodiment, the PCM 511 retains a sufficiently high viscosity even at its highest contemplated use temperature, to resist any settling of the first interstitial heat transfer structure 513 away from its dispersed configuration such that a heat-percolation path is retained between the die 112 and the thermal management device 114.

In a method embodiment, the interface subsystem 510 is reworked. Accordingly, the interface subsystem 510 is removed and a replacement interface subsystem is installed. In an embodiment, the interface subsystem 510 is heated above the softening temperature of the PCM 511 and the interface subsystem 510 is removed by physical action such as gentle wiping or gentle scraping. In an embodiment, the interface subsystem 510 is reworked at room temperature such as about 25° C. and the interface subsystem 510 is removed by physical action such as gentle wiping or gentle scraping.

Figure 6:
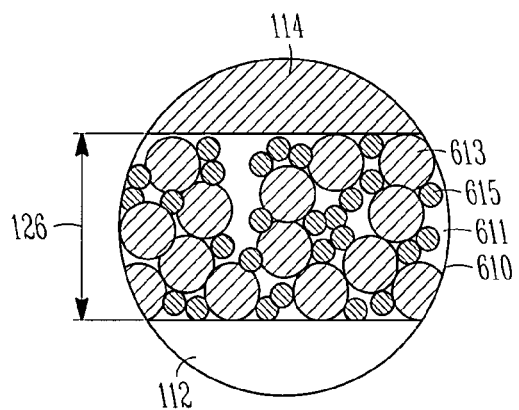
FIG. 6 is a detail section taken from FIG. 1 according to an embodiment.

FIG. 6 is a detail section taken from FIG. 1 according to an embodiment. The detail section is taken from the dashed line 2 in FIG. 1. FIG. 6 depicts the die 112 and the thermal management device 114, which sandwich the interface subsystem 610. In an embodiment, the interface subsystem 610 includes a PCM 611 that acts as a matrix for a first interstitial heat transfer structure 613 and a second interstitial heat transfer structure 615.

In an embodiment, the first interstitial heat transfer structure 613 is dispersion of particles that have an average diameter that is less than the BLT 126, and the second interstitial heat transfer structure 615 is a sub-interstitial particle size with respect to the first interstitial heat transfer structure 613. In an embodiment, the average diameter of the first interstitial heat transfer structure 613 is a fraction of the BLT 126 of about one-half or greater. In an embodiment, the average diameter of the first interstitial heat transfer structure 613 is a fraction of the BLT 126 of about one-third. In an embodiment, the average diameter of the first interstitial heat transfer structure 613 is a fraction of the BLT 126 of about one-fourth. In an embodiment, the average diameter of the first interstitial heat transfer structure 613 is a fraction of the BLT 126 of about one-fifth. In an embodiment, the average diameter of the first interstitial heat transfer structure 613 is a fraction of the BLT 126 of about one-tenth. In an embodiment, the average diameter of the first interstitial heat transfer structure 613 is a fraction of the BLT 126 of about one-twentieth. In an embodiment, any of the enumerated BLTs 126 set forth in this disclosure, is combined with any of the embodiments that are described in FIG. 6.

In an embodiment, the PCM 611 retains a sufficiently high viscosity even at its highest contemplated use temperature, to resist any settling of the first interstitial heat transfer structure 613 and the second interstitial heat transfer structure 615 away from their dispersed configurations such that a heat-percolation path is retained between the die 112 and the thermal management device 114.

In a method embodiment, the interface subsystem 610 is reworked. Accordingly, the interface subsystem 610 is removed and a replacement interface subsystem is installed. In an embodiment, the interface subsystem 610 is heated above the softening temperature of the PCM 611 and the interface subsystem 610 is removed by physical action such as gentle wiping or gentle scraping. In an embodiment, the interface subsystem 610 is reworked at room temperature such as about 25° C. and the interface subsystem 610 is removed by physical action such as gentle wiping or gentle scraping.

Figure 7:
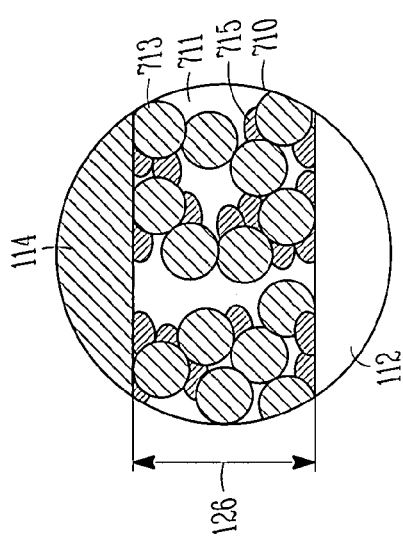
FIG. 7 is a detail section taken from FIG. 1 according to an embodiment.

FIG. 7 is a detail section taken from FIG. 1 according to an embodiment. The detail section is taken from the dashed line 2 in FIG. 1. FIG. 7 depicts the die 112 and the thermal management device 114, which sandwich the interface subsystem 710. In an embodiment, the interface subsystem 710 includes a PCM 711 that acts as a matrix for a first interstitial heat transfer structure 713 and a second interstitial heat transfer structure 715.

In an embodiment, the first interstitial heat transfer structure 713 is any of the metals, metal alloys, ceramics, or carbon or graphite particles or fibers set forth in this disclosure. The second interstitial heat transfer structure 715 is any of the low melting-point metals or their combinations as set forth in this disclosure. During thermal processing and/or field use of the interface subsystem 710, the low melting-point metal tends to wet a portion of the first interstitial heat transfer structure 713, and also the die 112 and the thermal management device 114. In this embodiment, the heat transfer percolation path between the die 112 and the thermal management device 114 is improved from a point-to-point contact path between particles, to a broader interface between and among the first interstitial heat transfer structure 713, the second interstitial heat transfer structure 715, and the die 112 and thermal management device 114.

In an embodiment, the first interstitial heat transfer structure 713 is dispersion of particles that have an average diameter that is less than the BLT 126. In an embodiment, the average diameter of the first interstitial heat transfer structure 713 is a fraction of the BLT 126 of about one-half or greater. In an embodiment, the average diameter of the first interstitial heat transfer structure 713 is a fraction of the BLT 126 of about one-third. In an embodiment, the average diameter of the first interstitial heat transfer structure 713 is a fraction of the BLT 126 of about one-fourth. In an embodiment, the average diameter of the first interstitial heat transfer structure 713 is a fraction of the BLT 126 of about one-fifth. In an embodiment, the average diameter of the first interstitial heat transfer structure 713 is a fraction of the BLT 126 of about one-tenth. In an embodiment, the average diameter of the first interstitial heat transfer structure 713 is a fraction of the BLT 126 of about one-twentieth. In an embodiment, any of the enumerated BLTs 126 set forth in this disclosure, is combined with any of the embodiments that are described in FIG. 7.

In an embodiment, the PCM 711 retains a sufficiently high viscosity even at its highest contemplated use temperature, to resist any settling of the first interstitial heat transfer structure 713 away from its dispersed configuration such that a percolation path is retained between the die 112 and the thermal management device 114.

In a method embodiment, the interface subsystem 710 is reworked. Accordingly, the interface subsystem 710 is removed and a replacement interface subsystem is installed. In an embodiment, the interface subsystem 710 is heated above the softening temperature of the PCM 711, and also optionally above the solidus temperature of the low melting-point metal that is the second interstitial heat transfer structure 715. In this method, even if some chemical wetting by the low melting-point metal on the die 112 or the thermal management device 114 occurs, the second interstitial heat transfer structure 715 is removed with minimal effort and only incidental, non-destructive wear to the backside surface 118 of the die.

Figure 8:
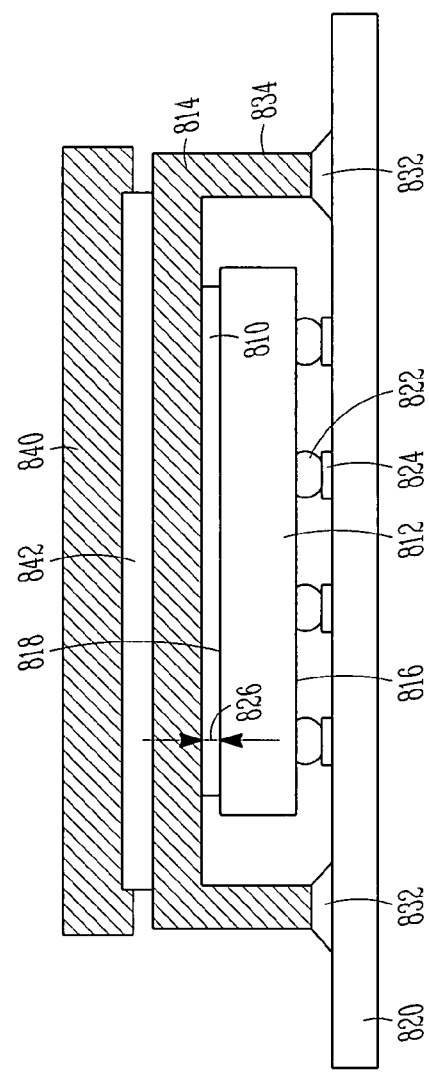
FIG. 8 is a side cross-section of a package according to an embodiment.

FIG. 8 is a side cross-section of a package 800 according to an embodiment. In an embodiment, the thermal management device is an integrated heat spreader (IHS) 814. A die 812 including an active surface 816 and backside surface 818 is below the IHS 814. An interface subsystem 810 is placed between the die 812 and the IHS 814. In an embodiment, any of the interface subsystems depicted in FIGS. 2-8, including their permutations with various BLTs and materials, is disposed between the backside surface 818 of the die and the IHS 814.

The IHS 814 is attached to a mounting substrate 820 with a bonding material 832 that secures a lip portion 834 of the IHS 814 thereto. In an embodiment, a fastener (not pictured) is driven upwardly through the mounting substrate 820 and attaches in the lip portion 834 of the IHS 814. In an embodiment, the fastener is a bolt that screws into a threaded receptacle in the lip portion 834 of the IHS 814. Other fasteners can be used according to conventional techniques. In an embodiment, the mounting substrate 820 is a printed circuit board (PCB), such as a main board, a motherboard, a mezzanine board, an expansion card, or another mounting substrate with a specific application.

In an embodiment, the thermal management device is a heat sink without a lip structure such as the planar heat sink 114 depicted in FIG. 1. The die 812 is disposed between the interface subsystem 810 and a series of electrical bumps 822 that are in turn each mounted on a series of bond pads 824. The electrical bumps 822 make contact with the active surface 816 of the die 812. By contrast, the interface subsystem 810 makes thermal contact with the backside surface 818 of the die 812. A BLT 826 is depicted that is the thickness of the interface subsystem 810. In one embodiment, the BLT 826 is in a range from about 10 µm to about 50 µm. In an embodiment, the BLT 826 is in a range from about 15 µm to about 40 µm. In an embodiment, the BLT 826 is in a range from about 20 µm to about 30 µm. In an embodiment, the BLT 826 is about 25 µm.

FIG. 8 depicts the interface subsystem 810 and the IHS 814 being thermally coupled to a heat slug 840 and a second TIM 842. The heat slug 840 is depicted generically, but it can include a heat sink, a heat pipe, a finned heat sink, or other heat-transfer structures. The heat slug 840 is also referred to herein as a second heat sink. In an embodiment, the second TIM 842 includes any of the PCM TIMs set forth in this disclosure.

In a method embodiment, the interface subsystem 810 is reworked. Accordingly, the interface subsystem 810 is removed, while the heat slug 840 and the second TIM 842 remain integral with the thermal management device 814. In an embodiment, the interface subsystem 810 is heated above the softening temperature of the PCM and the interface subsystem 810 is removed by physical action such as gentle wiping or gentle scraping. In an embodiment, the interface subsystem 810 is reworked at room temperature such as about 25° C. and the interface subsystem 810 is removed by physical action such as gentle wiping or gentle scraping. A replacement interface subsystem is installed.

In a method embodiment, the interface subsystem 810 and the second TIM 842 are reworked. Accordingly, the interface subsystem 810 and the second TIM 842 are removed. In an embodiment, the interface subsystem 810 the second TIM 842 are heated above the softening temperature of the PCMs, and the interface subsystem 810 and the second TIM 842 are removed by physical action such as gentle wiping or gentle scraping. In an embodiment, the interface subsystem 810 and the second TIM 842 are reworked at room temperature such as about 25° C., and the interface subsystem 810 and the second TIM 842 are removed by physical action such as gentle wiping or gentle scraping. A replacement interface subsystem and a replacement second TIM are installed.

In a method embodiment, the second TIM 842 is reworked. Accordingly, the second TIM 842 is removed. In an embodiment, the second TIM 842 is heated above the softening temperature of the PCM and the second TIM 842 is removed by physical action such as gentle wiping or gentle scraping. In an embodiment, the second TIM 842 is reworked at room temperature such as about 25° C. and the second TIM 842 is removed by physical action such as gentle wiping or gentle scraping. A replacement for the second TIM is installed.

Figure 9:
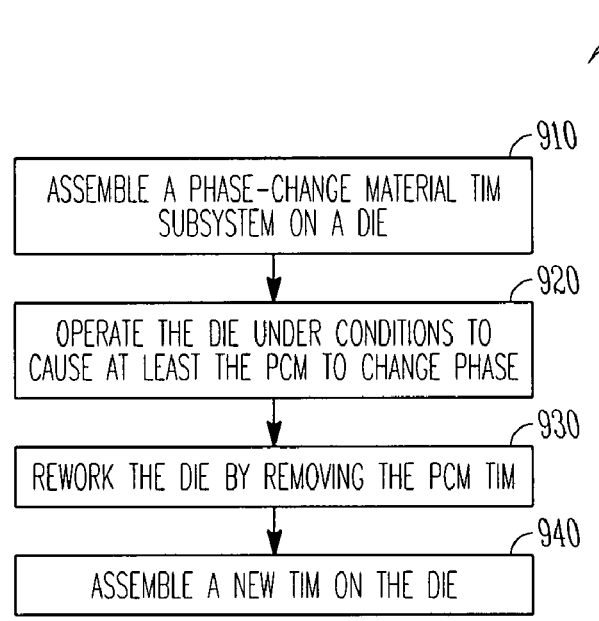
FIG. 9 is a method flow diagram according to various embodiments.

FIG. 9 is a method flow diagram according to various embodiments. At 910, the method includes assembling a reworkable PCM TIM subsystem on a die. In an embodiment, the method flow is complete at 910. In an alternative embodiment, the reworkable PCM TIM subsystem is first assembled on a thermal management device such as the thermal management device 114 depicted in FIG. 1. Thereafter the reworkable PCM TIM subsystem is assembled on the die. In an embodiment where a given low melting-point metal is used, the solidus temperature therefore is reached.

At 920 the method includes operating the die under conditions to at least soften the PCM and thereby allow the heat transfer particulates to better contact both the die and the thermal management device. In an embodiment, the method flow is complete at 920.

At 930, the method includes removing the PCM TIM. According to an embodiment, the method includes heating the PCM to a softening point such that it can be removed by a gentle wiping action or a gentle scraping action. According to an embodiment, the method includes heating at least one of the first interstitial heat transfer structure and the second interstitial heat transfer, if present, to its solidus temperature and thereafter removing the PCM TIM by a gentle wiping action or a gentle scraping action. In an embodiment, the method flow is complete at 930.

At 940, the method includes assembling a new TIM to the die. In an alternative embodiment, the new TIM is first assembled to a thermal management device such at the thermal management device 114 depicted in FIG. 1. Thereafter the new TIM is assembled to the die. In an embodiment the replacement TIM is a solder.

Figure 10:
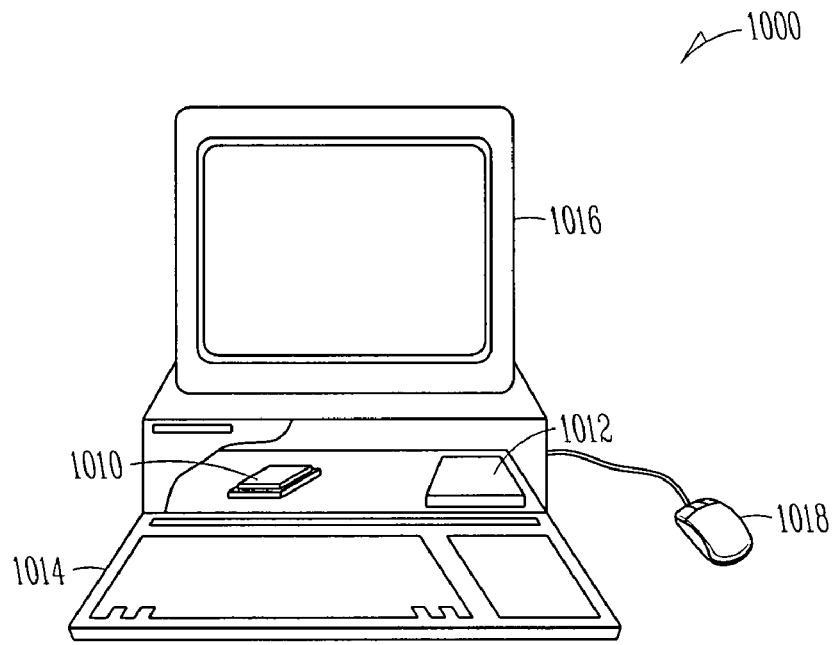
FIG. 10 is a depiction of a computing system according to an embodiment.

FIG. 10 is a schematic of a computing system 1000 according to an embodiment. In another embodiment, the computing system is a notebook computer. One or more of the foregoing embodiments of a reworkable PCM TIM may be utilized in a package for a computing system, such as the computing system 1000 of FIG. 10. The computing system 1000 includes at least one processor (not pictured) packaged with a reworkable PCM TIM 1010, a data storage system 1012, at least one input device such as keyboard 1014, and at least one output device such as a monitor 1016, for example. The computing system 1000 includes a processor that processes data signals, and may comprise, for example, a microprocessor, available from Intel Corporation. In addition to the keyboard 1014, the computing system 1000 can include another user input device such as a mouse 1018, for example. The computing system 1000 may utilize one or more microelectronic packages such as described in one or more of the foregoing embodiments. For purposes of this application, a computing system 1000 embodying components in accordance with the claimed subject matter may include any system that utilizes a microelectronic package, which may include, for example, a data storage device such as dynamic random access memory, polymer memory, flash memory, and phase-change memory. The microelectronic package can also include a die which contains a digital signal processor (DSP), a micro controller, an application specific integrated circuit (ASIC), or a microprocessor. It can now be appreciated that embodiments set forth in this disclosure can be applied to devices and apparatuses other than a traditional computer. For example, a die can be packaged with an embodiment of the reworkable PCM TIM and placed in a portable device such as a wireless communicator or a hand-held device such as a personal data assistant and the like. Another example is a die that can be packaged with an embodiment of the reworkable PCM TIM and placed in a vehicle such as an automobile, a locomotive, a watercraft, an aircraft, or a spacecraft.

The Abstract is provided to comply with 37 C.F.R. §1.72(b) requiring an Abstract that will allow the reader to quickly ascertain the nature and gist of the technical disclosure. It is submitted with the understanding that it will not be used to interpret or limit the scope or meaning of the claims.

In the foregoing Detailed Description, various features are grouped together in a single embodiment for the purpose of streamlining the disclosure. This method of disclosure is not to be interpreted as reflecting an intention that the claimed embodiments of the invention require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate preferred embodiment.

It will be readily understood to those skilled in the art that various other changes in the details, material, and arrangements of the parts and method stages which have been described and illustrated in order to explain the nature of this invention may be made without departing from the principles and scope of the invention as expressed in the subjoined claims.

What is claimed is:

1. A package comprising:
a die;
a first heat sink;
a thermal interface material disposed between the die and the first heat sink, the thermal interface material including:
a matrix, wherein the matrix exhibits a phase change between about 30° C. and about 100° C.; and
a distribution of first interstitial heat transfer structures in the matrix, including a size range from about 5 micron to about 25 micron, and wherein the distribution of first interstitial heat transfer structures occupies from about 5 volume percent to about 95 volume percent of the composition;
wherein the die is separated from the first heat sink by less than or equal to about 30 micron;
a second heat sink disposed above the first heat sink; and
a thermal interface material disposed between the first heat sink and the second heat sink, including:
a second heat sink matrix, wherein the second heat sink matrix exhibits a phase change between about 30° C. and about 100° C.; and
a distribution of first interstitial heat transfer structures in the second heat sink matrix, including a size range from about 5 micron to about 1,000 micron, and wherein the distribution of first interstitial heat transfer structures occupies from about 5 volume percent to about 95 volume percent of the composition.

2. The package of claim 1, further including:
a second heat sink disposed above the first heat sink.

3. The package of claim 1, wherein the matrix is selected from silicone, an amino epoxy, an acrylate, an olifin resin, a vinyl, an acrylic, a natural rubber, and a synthetic rubber.

4. The package of claim 1, wherein the matrix is selected from silicone, an amino epoxy, an acrylate, an olifin resin, a vinyl, an acrylic, a natural rubber, and a synthetic rubber, and wherein a wetting agent is present from about 1 to about 25 percent, the matrix is present from about 4 to about 75 percent.

5. The package of claim 1, wherein the die includes a bare die.

6. The package of claim 1, wherein the die includes a bare die in a mobile device.

7. A computing system comprising:
a die;
a first heat sink;
a thermal interface material disposed between the die and the first heat sink, the thermal interface material including:
a matrix, wherein the matrix exhibits a phase change between about 30° C. and about 100° C.; and
a distribution of first interstitial heat transfer structures in the matrix, including a size range from about 5 micron to about 25 micron, and wherein the distribution of first interstitial heat transfer structures occupies from about 5 volume percent to about 95 volume percent of the composition;
wherein the die is separated from the first heat sink by less than or equal to about 30 micron;
a second heat sink disposed above the first heat sink; and
a thermal interface material disposed between the first heat sink and the second heat sink, including:
a second heat sink matrix, wherein the second heat sink matrix exhibits a phase change between about 30° C. and about 100° C.; and a distribution of first interstitial heat transfer structures in the second heat sink matrix, including a size range from about 5 micron to about 1,000 micron, and wherein the distribution of first interstitial heat transfer structures occupies from about 5 volume percent to about 95 volume percent of the composition; and a data storage system coupled to the die.

8. The computing system of claim 7, wherein the computing system is disposed in one of a notebook computer, a desktop computer, a wireless communicator, a hand-held device, an automobile, a locomotive, an aircraft, a watercraft, and a spacecraft.

9. The computing system of claim 7, wherein the die is selected from a data storage device, a digital signal processor, a micro-controller, an application specific integrated circuit, and a microprocessor.

10. The computing system of claim 7, wherein the die includes a bare die.

11. The computing system of claim 7, wherein the die includes a bare die in a mobile device.

12. The package of claim 1, wherein the die is a bare die.

13. The package of claim 1, wherein the die is a bare die in a mobile device.

14. The package of claim 1, wherein the distribution of first interstitial heat transfer structures is selected from aluminum, aluminum alloys, copper, copper alloys, silver, silver alloys, tin, tin alloys, dielectrics, graphite, carbon fibers and combinations thereof.

15. The package of claim 1, further including a distribution of second interstitial heat transfer structures, wherein the distribution of second interstitial heat transfer structures includes a low melting-point metal.

16. The package of claim 1, further including a distribution of second interstitial heat transfer structures, wherein the distribution of second interstitial heat transfer structures is present in a greater weight concentration than the distribution of first interstitial heat transfer structures.

17. An article comprising:

a die;

a first heat sink; and a thermal interface material disposed between the die and fir first heat sink, the thermal interface material including:

a matrix including a first surface and a second surface that is parallel planar to the first surface, wherein the matrix exhibits a phase change between about 30° C. and about 100° C., and wherein the first surface is separated from the second surface by less than or equal to about 30 micron; and a distribution of contiguous first interstitial heat transfer structures exhibiting a contiguous interstitial heat transfer structure path in the matrix, including a size range from about 5 micron to about 25 micron, and wherein the distribution of first interstitial heat transfer structures occupies from about 5 volume percent to about 95 volume percent of the composition;

a second heat sink disposed above the first heat sink;

a thermal interface material disposed between the first heat sink and the second heat sink, including:

a second heat sink matrix, wherein the second heat sink matrix exhibits a phase change between about 30° C. and about 100° C.; and a distribution of first interstitial heat transfer structures in the second heat sink matrix, including a size range from about 5 micron to about 1,000 micron, and wherein the distribution of first interstitial heat transfer structures occupies from about 5 volume percent to about 95 volume percent of the composition.

18. The article of claim 17, wherein the contiguous first interstitial heat transfer structure path originates at the first surface and terminates at the second surface, and wherein the contiguous interstitial heat transfer structure path includes four or fewer interstitial heat transfer structures.

19. The article of claim 17, further including:

a distribution of second interstitial heat transfer structures, wherein a portion of the distribution of second interstitial heat transfers includes one interface exposed at least one of the first surface and the second surface, and one interface exposed to at least one of the distribution of first interstitial heat transfer structures.

20. The article of claim 17, further including:

a distribution of second interstitial heat transfer structures, wherein a portion of the distribution of second interstitial heat transfer structures includes one interface exposed at least one of the first surface and the second surface, and one interface exposed to at least one of the distribution of first interstitial heat transfer structures, and wherein the distribution of second interstitial heat transfer structures is present in a greater weight concentration than the distribution of first interstitial heat transfer structures.

21. The article of claim 17, wherein the matrix is selected from silicone, an amino epoxy, an acrylate, an olifin resin, a vinyl, an acrylic, a natural rubber, and a synthetic rubber.

22. The article of claim 17, wherein the matrix is selected from silicone, an amino epoxy, an acrylate, an olifin resin, a vinyl, an acrylic, a natural rubber, and a synthetic rubber, and wherein the wetting agent is present from about 1 to about 25 percent, the matrix is present from about 4 to about 75 percent.

23. The computing system of claim 7, wherein the die is a bare die.

24. The computing system of claim 7, wherein the die is a bare die in a mobile device.

25. The computing system of claim 7, wherein the distribution of first interstitial heat transfer structures is selected from aluminum, aluminum alloys, copper, copper alloys, silver, silver alloys, tin, tin alloys, dielectrics, graphite, carbon fibers and combinations thereof.

26. The computing system of claim 7, further including a distribution of second interstitial heat transfer structures, wherein the distribution of second interstitial heat transfer structures includes a low melting-point metal.

27. The computing system of claim 7, further including a distribution of second interstitial heat transfer structures, wherein the distribution of second interstitial heat transfer structures is present in a greater weight concentration than the distribution of first interstitial heat transfer structures.

28. The computing system of claim 7, wherein the matrix is selected from silicone, an amino epoxy, an acrylate, an olifin resin, a vinyl, an acrylic, a natural rubber, and a synthetic rubber.

29. The computing system of claim 7, wherein the matrix is selected from silicone, an amino epoxy, an acrylate, an olifin resin, a vinyl, an acrylic, a natural rubber, and a synthetic rubber, and wherein the wetting agent is present from about 1 to about 25 percent, the matrix is present from about 4 to about 75 percent.

* * * * *

UNITED STATES PATENT AND TRADEMARK OFFICE
CERTIFICATE OF CORRECTION

PATENT NO. : 7,253,523 B2 Page 1 of 1
APPLICATION NO. : 10/630550
DATED : August 7, 2007
INVENTOR(S) : Dani et al.

It is certified that error appears in the above-identified patent and that said Letters Patent is hereby corrected as shown below:

On the Title page, item (56), under "U.S. Patent Documents", in column 2, line 1, delete "H." and insert -- Bunyan --, therefor.

Signed and Sealed this

Twentieth Day of May, 2008

JON W. DUDAS
*Director of the United States Patent and Trademark Office*